(12) United States Patent
Teng et al.

(10) Patent No.: US 11,807,520 B2
(45) Date of Patent: Nov. 7, 2023

(54) SEMICONDUCTOR STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Yi-Chuan Teng, Hsinchu County (TW); Ching-Kai Shen, Hsinchu County (TW); Jung-Kuo Tu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/356,437

(22) Filed: Jun. 23, 2021

(65) Prior Publication Data
US 2022/0411260 A1    Dec. 29, 2022

(51) Int. Cl.
*B81B 7/00*        (2006.01)
*B81C 1/00*        (2006.01)

(52) U.S. Cl.
CPC ........ *B81B 7/0035* (2013.01); *B81C 1/00277* (2013.01); *B81C 2203/019* (2013.01); *B81C 2203/0145* (2013.01)

(58) Field of Classification Search
CPC ... B81B 7/0035; B81B 7/0038; B81B 7/0041; B81B 2207/098; B81B 2207/094; B81B 2207/095; B81B 2207/096; B81B 2207/11; B81B 2207/115; B81B 2207/99; B81C 1/00277; B81C 1/00285; B81C 1/00293;

(Continued)

(56) References Cited

U.S. PATENT DOCUMENTS

| 7,098,065 B2 * | 8/2006 | Chiu ................... B81C 1/00333 |
| | | 73/514.31 |
| 2005/0050859 A1 * | 3/2005 | Coppeta ................. H01L 21/50 |
| | | 53/485 |

(Continued)

FOREIGN PATENT DOCUMENTS

| TW | 201532287 A | 8/2015 |
| TW | 201716314 A | 5/2017 |
| WO | 0242716 A2 | 5/2002 |

OTHER PUBLICATIONS

Non-Final Office Action of the TW family application (TW Appl. No. 110130522) dated Dec. 10, 2021.

*Primary Examiner* — Jesse Y Miyoshi
(74) *Attorney, Agent, or Firm* — WPAT LAW; Anthony King (57) ABSTRACT

A semiconductor structure is provided. The semiconductor structure includes a first substrate, a semiconductor layer, a second substrate, and a eutectic sealing structure. The semiconductor layer is over the first substrate. The semiconductor layer has a cavity at least partially through the semiconductor layer. The second substrate is over the semiconductor layer. The second substrate has a through hole. The eutectic sealing structure is on the second substrate and covers the through hole. The eutectic sealing structure comprises a first metal layer and a second metal layer eutectically bonded on the first metal layer. A method for manufacturing a semiconductor structure is also provided.

20 Claims, 11 Drawing Sheets

(58) Field of Classification Search
CPC .... B81C 2203/0145; B81C 2203/0172; B81C 2203/0181; B81C 2203/019
See application file for complete search history.

(56) References Cited

U.S. PATENT DOCUMENTS

| | | | |
|---|---|---|---|
| 2009/0140146 A1* | 6/2009 | Sogawa | H01L 27/14618 53/405 |
| 2012/0104593 A1* | 5/2012 | Kanemoto | B81C 1/00333 257/729 |
| 2012/0299127 A1* | 11/2012 | Fujii | G01L 9/0085 257/415 |
| 2013/0012078 A1* | 1/2013 | Fischer | B01L 3/502707 29/458 |
| 2016/0060103 A1* | 3/2016 | Hung | B81C 1/00238 438/51 |
| 2017/0113925 A1 | 4/2017 | Rey | |
| 2019/0161346 A1* | 5/2019 | Lee | B81B 7/02 |

* cited by examiner

SEMICONDUCTOR STRUCTURE AND METHOD FOR MANUFACTURING THEREOF

FIELD

The present disclosure relates to a semiconductor structure and method for manufacturing thereof, particularly, the disclosed semiconductor structure has a cavity sealed by a eutectic sealing structure, which may provide high structure strength in preventing the forming of micro leak paths.

BACKGROUND

A microelectromechanical system (MEMS) device is a piece of technology with components on a very small scale. MEMS devices have found widespread use in many modern day electronic devices, and may have components within the micrometer size range and sometimes within the nanometer size range. A typical MEMS device may include processing circuitry as well as mechanical components, such as for various types of sensors. These sensors may be used as part of a Radio Frequency (RF) switch, gyroscope, accelerometer, microphone membrane, or motion sensor, responses from which are provided to and processed by the included processing circuitry. For example, MEMS accelerometers are commonly found in automobiles (e.g., in airbag deployment systems), tablet computers or in smart phones. For many applications, MEMS devices are electrically connected to application-specific integrated circuits (ASICs) to form complete MEMS systems.

The mechanical components of MEMS devices are often provided in chambers or including chambers per se, wherein such chambers may be sealed. In the development of MEMS, the sealing performance is a concerned issue because micro leak paths may be formed in low-quality sealing structures and thus damaged the pressure status of the MEMS devices.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Some MEMS devices, such as gyroscopes, microphone membranes, pressure sensors, ultrasonic sensors, or the like, comprise a sealed chamber or cavity that having an extreme low pressure therein, and the moveable structures of MEMS devices may thus accurately response to external stimuli, such as acceleration, pressure, or gravity.

In forming the MEMS device including a hermetically-sealed cavity, the cavity may be in fluid communication with the outside atmosphere via small vent holes formed in the substrate or the wafer and sealed using thick metal. However, cracks may occur due to metal grain growth, causing micro leaks in the thick metal, particularly if the critical dimension (CD) of the vent hole is not small enough. In order to prevent the forming of the micro leak, a small critical dimension is one approach to ensuring the sealing ability of the thick metal, but such small critical dimensions are constrained by limits to etching. For example, the substrate or wafer may have a thickness greater than about 170 μm, while the vent holes may have a width less than 1 μm; etching through the substrate or wafer under such aspect ratio is difficult.

Due to the above limitations, attempts to reduce the critical dimension of the vent hole by deep silicon dry etching operations such as deep reactive-ion etching may not be able to prevent the forming of cracks during metal deposition operations, and the vacuum seal may fail.

Furthermore, during the thick metal sealing operation, the pressure in the cavity is not tunable due to the limitation of metal sputtering tools; accordingly, the cavity pressure is substantially limited to a high vacuum level, which narrows the potential applications of the MEMS device.

Therefore, the present disclosure provides a semiconductor structure including eutectic sealing structures for sealing the through holes of the substrate, wherein such sealing structure is not constrained by the critical dimensions of the through holes, and the pressure in the cavity connected to the through holes is tunable during the formation of the eutectic sealing structure.

Figure 1:
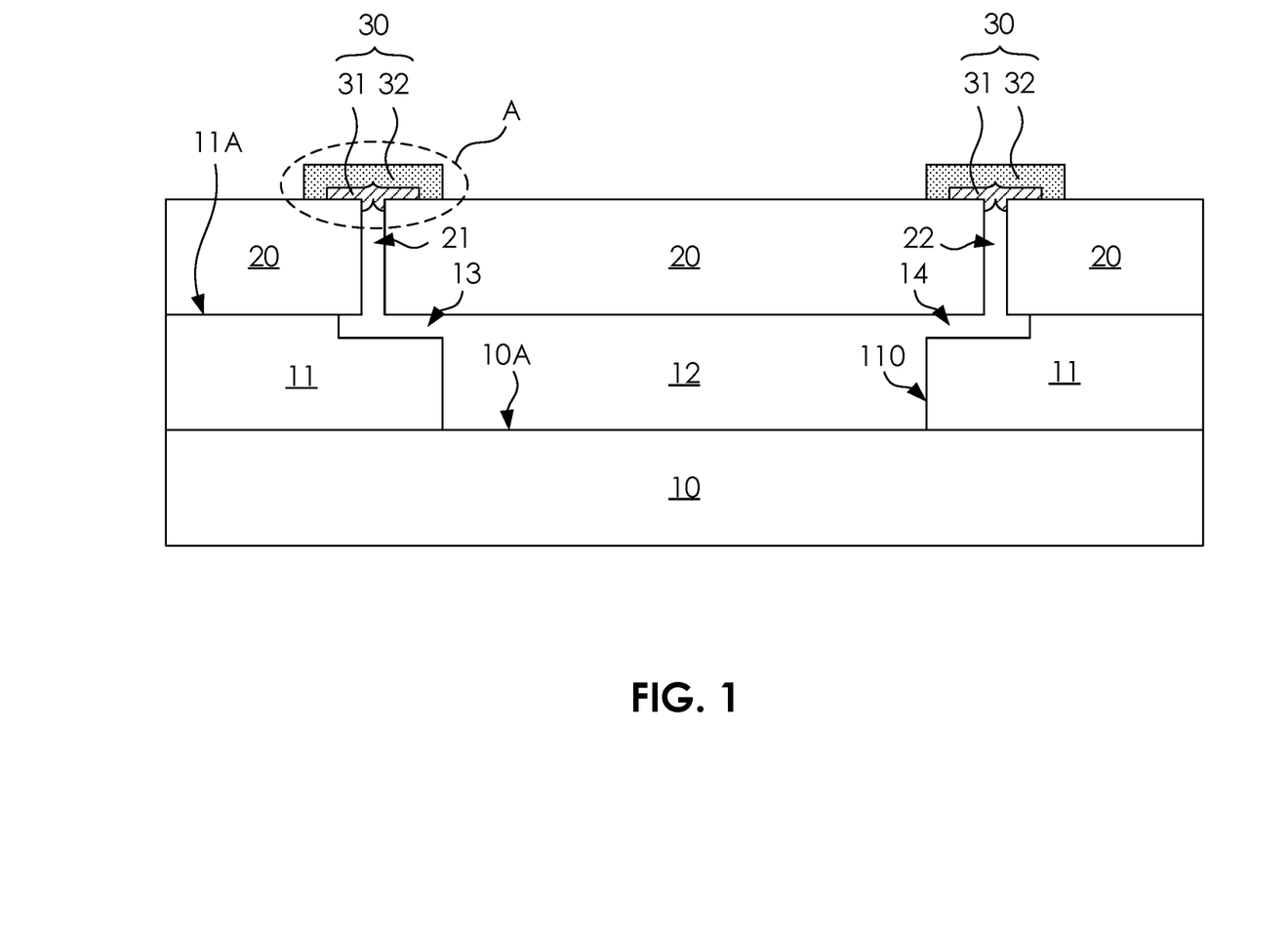
FIG. 1 illustrates a cross-sectional view of a semiconductor structure according to some embodiments of the present disclosure.

FIG. 1 illustrates a semiconductor structure including a sealed structure according to some embodiments of the present disclosure. As shown in the FIG. 1, the semiconductor includes a first substrate 10, a semiconductor layer 11, a second substrate 20, and a eutectic sealing structure 30. The semiconductor layer 11 is over the first substrate 10. The second substrate 20 is over the semiconductor layer 11. The eutectic sealing structure 30 is on the second substrate 20.

In some embodiments, the first substrate 10 is a silicon substrate or a silicon wafer. In some embodiments, the first substrate 10 may be made of another semiconductor material such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the first substrate 10 may include a silicon-on-insulator (SOI) substrate. Generally, an SOI substrate includes a layer of semiconductor material such as epitaxial silicon, germanium, silicon germanium, SOI, silicon germanium on insulator (SGOI), or a combination thereof. The first substrate 10 may be doped with a p-type dopant such as boron, boron fluorine, aluminum, gallium, or the like. The substrate may alternatively be doped with an n-type dopant such as phosphorus, arsenic, antimony, or the like.

The semiconductor layer 11, disposed over the first substrate 10 may be a handle layer that includes a cavity 12 at least partially through the semiconductor layer 11. In some embodiments, the cavity 12 exposes the top surface 10A of the first substrate 10.

Figure 2:
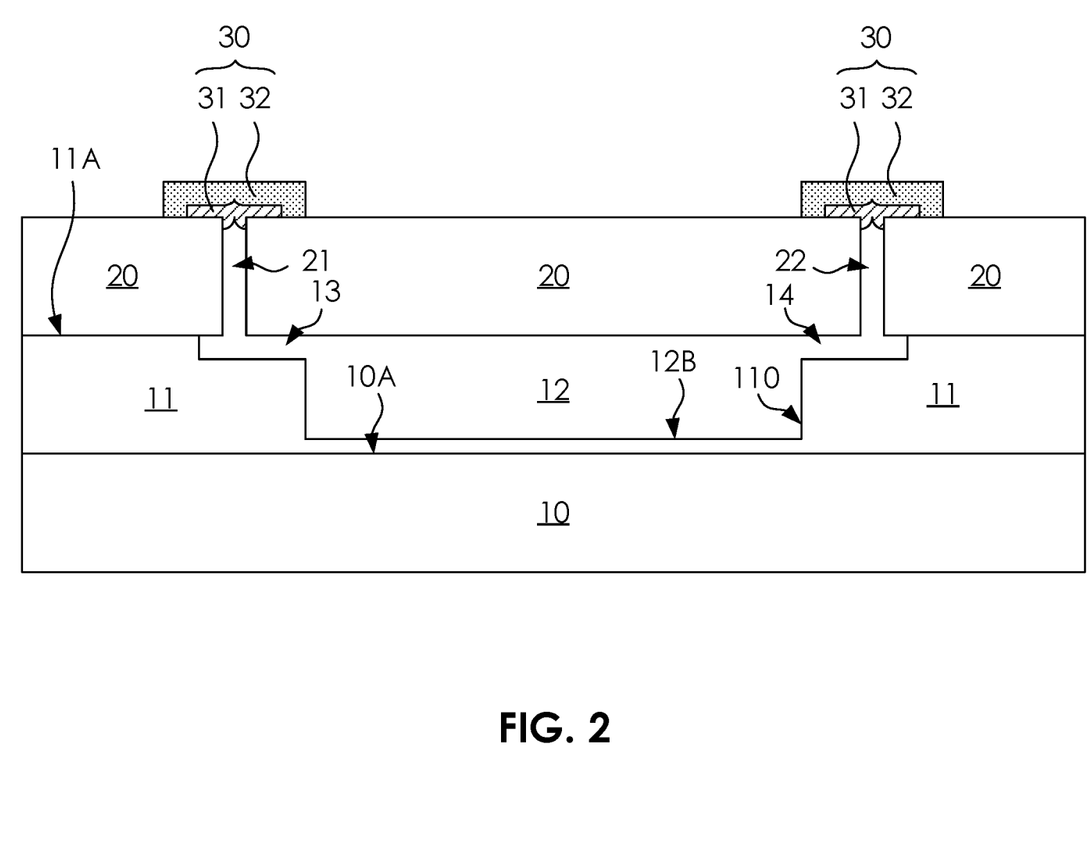
FIG. 2 illustrates a cross-sectional view of a semiconductor structure according to some embodiments of the present disclosure.

As shown in FIG. 2, in other embodiments, the cavity 12 may extend from a top surface 11A of the semiconductor layer 11 down to a cavity bottom 12B such that a thin portion of the semiconductor layer 11 remains between the cavity bottom 12B and the top surface 10A of the first substrate 10. The depth of the cavity 12 may determine the thickness of the thin portion which in turn determines the full-scale pressure range of the pressure sensor.

In some embodiments, the semiconductor layer 11 has an interior sidewall 110 that is substantially vertical or orthogonal to the top surface 10A of the first substrate 10.

In some embodiments, the second substrate 20 is bonded on the semiconductor layer 11. The bonding of the second substrate 20 to the semiconductor layer 11 may cause the cavity 12 to become a chamber. In some embodiments, the second substrate 20 is a silicon substrate or a silicon wafer. In some embodiments, the second substrate 20 may be made of other semiconductor materials. Additionally, the second substrate 20 may include a silicon-on-insulator (SOI) substrate. Generally, an SOI substrate includes a layer of semiconductor material such as epitaxial silicon, germanium, silicon germanium, SOI, silicon germanium on insulator (SGOI), or a combination thereof. In some embodiments, the second substrate 20 may be identical to the first substrate 10.

In some embodiments, the second substrate 20 includes a first through hole 21 and a second through hole 22. The first through hole 21 and the second through hole 22 may be used to connect the cavity 12 with the outside atmosphere or allow the cavity 12 to be in fluid communication with the outside atmosphere prior to the cavity 12 being sealed by the eutectic sealing structure 30. In some embodiments, widths of the first through hole 21 and the second through hole 22 may be in a range between about 0.3 μm and about 0.8 μm. The lower limit of the widths of the first through hole 21 and the second through hole 22 is related to the thickness of the second substrate 20. In some embodiments, the thickness of the second substrate 20 is in a range between about 170 μm and about 180 μm; higher aspect ratios of the hole may result in increased difficulty in formation of the device. In some embodiments, the first through hole 21 and the second through hole 22 may be referred to as vents, openings, slots, channels, or the like.

In some embodiments, the upper limit of the widths of the first through hole 21 and the second through hole 22 may be increased by using the eutectic sealing structure of the present disclosure. That is, the etching window of the sealing patterns (e.g., the first through hole 21 and the second through hole 22) may not be limited to small vents or holes that are less than 0.8 μm in width, but can instead be a plurality of larger vents or holes of several micrometers in width due to properties of the eutectic metal. Generally, a wider etching window may benefit the process robustness.

In some embodiments, the semiconductor layer 11 may further include a first trench 13 and a second trench 14 adjacent to the cavity 12 at the top surface 11A of the semiconductor layer 11. A bottom surface of each of the first trench 13 and the second trench 14 is higher than the cavity bottom 12B. In such embodiments, the cavity 12 may connect to the outside atmosphere or may be in fluid communication with the outside atmosphere through connection paths formed by the first trench 13 and the first through hole 21, and by the second trench 14 and the second through hole 22. In other words, the first trench 13 and the second trench 14 are formed as micro channels for air flow.

Figure 3:
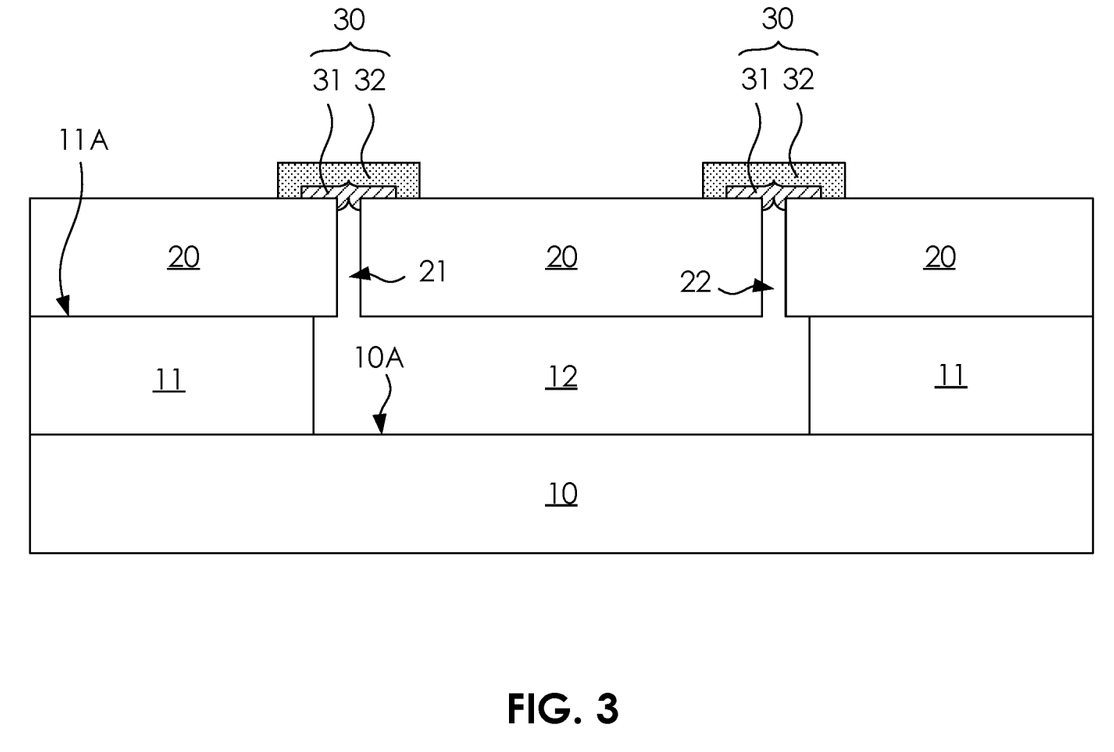
FIG. 3 illustrates a cross-sectional view of a semiconductor structure according to some embodiments of the present disclosure.

In some embodiments, the cavity 12 is free of overlap with the first through hole 21 and the second through hole 22 from a top view perspective. For instance, the first through hole 21 and the second through hole 22 may be symmetrically arranged in proximity to the interior sidewalls 110 of the semiconductor layer 11. As shown in FIG. 3, in other embodiments, the first through hole 21 and the second through hole 22 may be arranged directly over the cavity 12, without using the first trench 13 and the second trench 14 as micro channels between the holes and the cavity 12.

In the present disclosure, the cavity 12 is sealed by the eutectic sealing structure 30 covering the first and second through holes 21, 22. In some embodiments, the eutectic sealing structure 30 includes a first metal layer 31 and a second metal layer 32 eutectically bonded on the first metal layer 31. The materials of the first metal layer 31 and the second metal layer 32 may diffuse into each other at a eutectic temperature to form a eutectic region that can prevent leakage. In some embodiments, the eutectic sealing structure 30 may include aluminum (Al), germanium (Ge), copper (Cu), gold (Au), stannum (Sn), indium (In), lead (Pb), or palladium (Pd). For instance, the materials for forming the first metal layer 31 and the second metal layer 32 may be grouped in combinations of Al/Ge, Au/Sn, In/Pd, Pb/Sn, Cu/Sn, or the like. Other combinations may also be utilized to form eutectic alloys.

In some embodiments, the thickness of the first metal layer 31 is less than the thickness of the second metal layer 32. Generally, the ratio of the volume of the first metal layer 31 to the volume of the second metal layer 32 depends on the eutectic property of the materials thereof. In some embodiments, the volume of the first metal layer 31 is less than the volume of the second metal layer 32. In some embodiments, the first metal layer 31 is laterally surrounded by the second metal layer 32.

In some embodiments, the materials of the first metal layer 31 and the second metal layer 32 may be interchanged. For example, when the group of Au/Sn is used, one of the metal layers may be made of aluminum, whereas the other metal layer may be made of stannum, or vice versa.

Figure 4A:
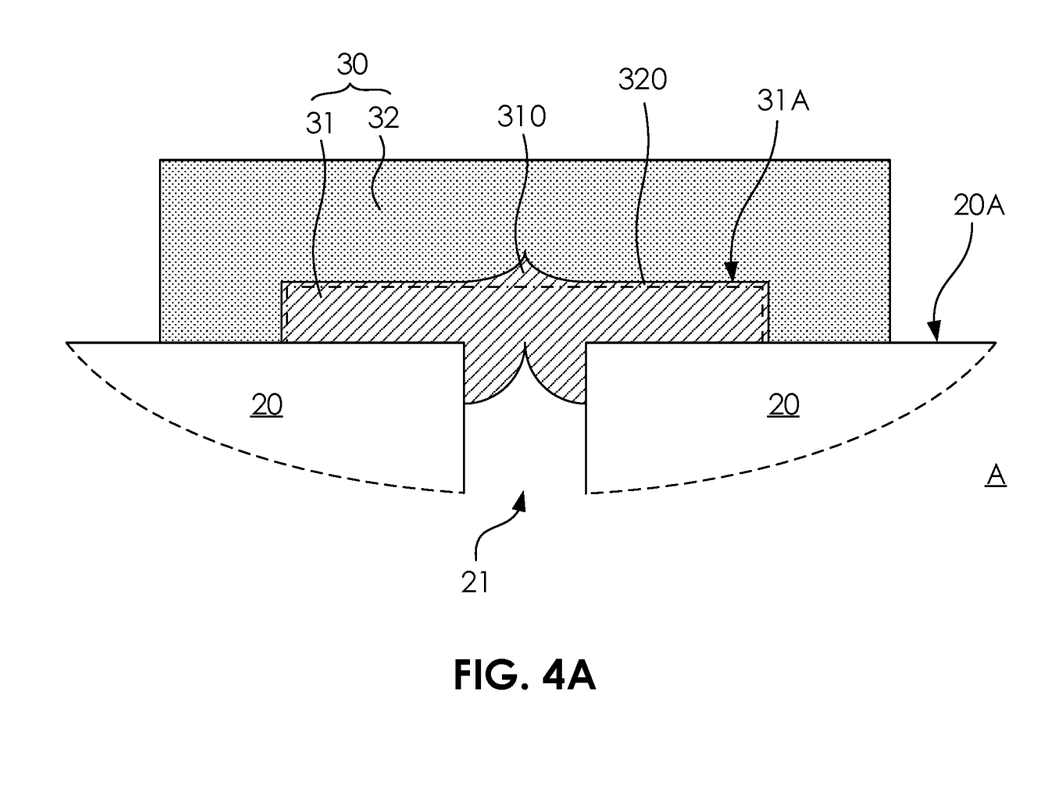
FIG. 4A illustrates a cross-sectional view of a portion of a semiconductor structure according to some embodiments of the present disclosure.

As shown in FIG. 4A, which is an enlarged view of region A in FIG. 1, in some embodiments, a portion of the first metal layer 31 extend into the first through hole 21. The portion of the first metal layer 31 may extend from the top surface of the second substrate 20 to the first through hole 21 along the inner surface of the first through hole 21, and therefore a portion of the first metal layer 31 proximal to the inner surface of the first through hole 21 may have a greater thickness than portions of the first metal layer 31 distal to the inner surface of the first through hole 21. That is, the first metal layer 31 may include an inward curve in the first through hole 21. In some embodiments, the first metal layer 31 also includes the inward curve in the second through hole 22.

In some embodiments, the first metal layer 31 includes a protrusion 310 at a top surface 31A of the first metal layer 31. In some embodiments, the protrusions 310 may overlap the first through hole 21 and the second through hole 22 of the second substrate 20. The height of the protrusion 310 is less than the thickness of a portion of the first metal layer 31 having a flat surface. In some embodiments, the eutectic sealing structure 30 may include a eutectic region 320 proximal to the interface between the first metal layer 31 and the second metal layer 32. In some embodiments, the eutectic region 320 may include the material of the first metal layer 31 and the material of the second metal layer 32 connected in a eutectic state, or formed via eutectic bonding or eutectic soldering. That is, the eutectic region 320 is where the combination of two or more metals allows direct transformation from solid state to liquid state or vice versa at a specific temperature without passing a two-phase equilibrium. The metals may diffuse into each other at the eutectic temperature, wherein the eutectic temperature is much lower than the melting temperature of the metals that are involved in the bonding process. Accordingly, in some embodiments of the present disclosure, the through holes, vents, openings, slots, or channels of the second substrate 20 may be sealed from the top surface 20A of the second substrate 20, thereby ensuring the airtightness of the cavity 12 between the first substrate 10 and the second substrate 20.

Figure 4B:
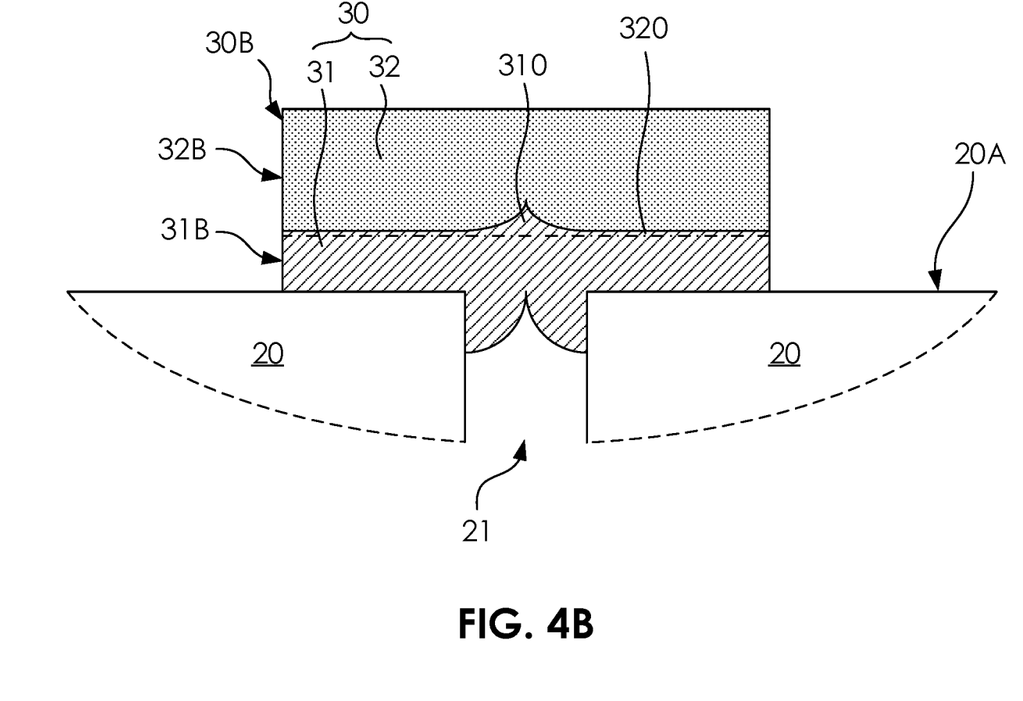
FIG. 4B illustrates a cross-sectional view of a portion of a semiconductor structure according to some embodiments of the present disclosure.
Figure 4C:
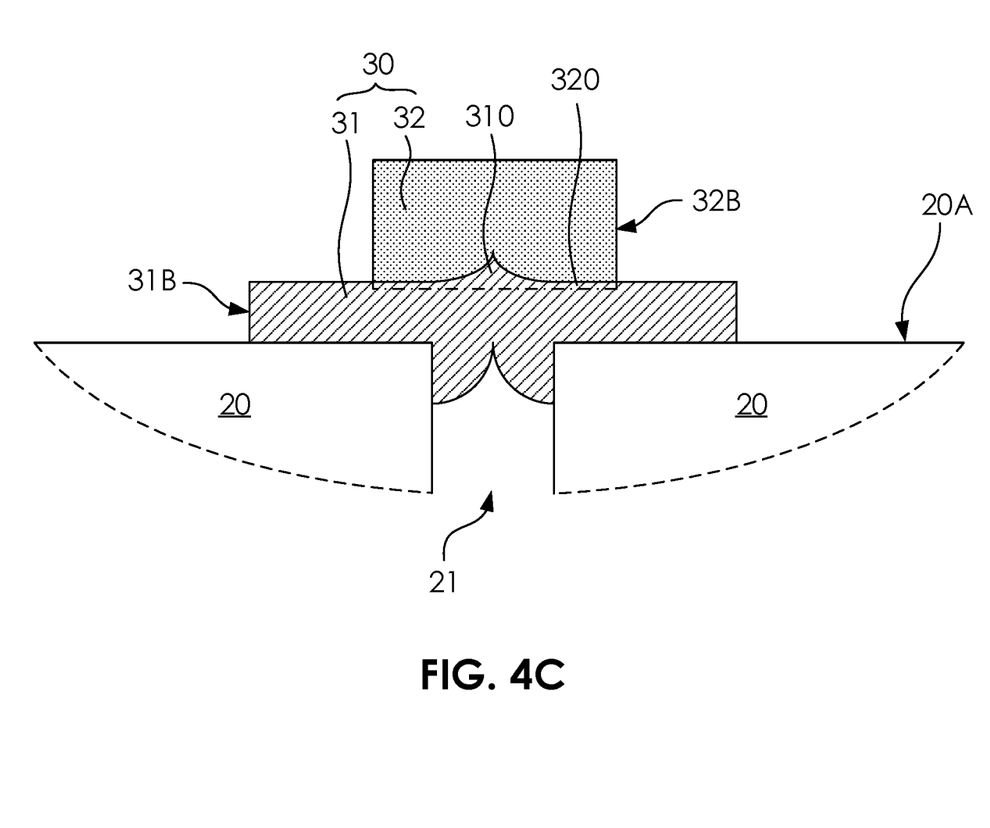
FIG. 4C illustrates a cross-sectional view of a portion of a semiconductor structure according to some embodiments of the present disclosure.

As shown in FIG. 4B, in some embodiments, the first metal layer 31 is substantially covered by the second metal layer 32, whereas a first sidewall 31B of the first metal layer 31 is exposed from the second metal layer 32. For example, the first sidewall 31B of the first metal layer 31 may be aligned to a second sidewall 32B of the second metal layer 32; hence, a lateral surface 30B of the eutectic sealing structure 30 substantially has a continuous line from a cross-sectional perspective in such embodiments. As shown in FIG. 4C, in other embodiments, the second metal layer 32 is disposed on the first metal layer 31 to form the eutectic region 320 overlapping the first through hole 21, and the first metal layer 31 may be partially covered by the second metal layer 32 in the case of the width of the first metal layer 31 is less than the width of the second metal layer 32.

Figure 5A:
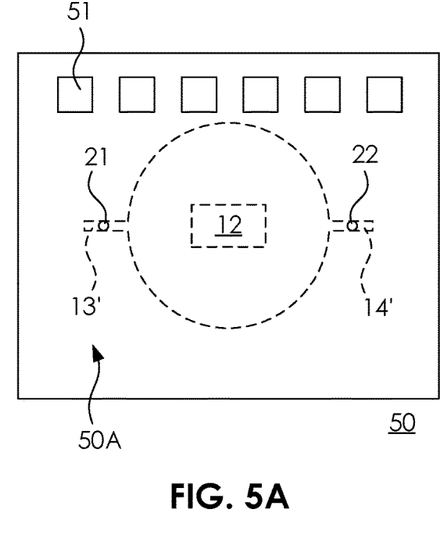
FIG. 5A illustrates a top view of a semiconductor structure according to some embodiments of the present disclosure, wherein the eutectic sealing structure is omitted to illustrate the through holes.
Figure 5B:
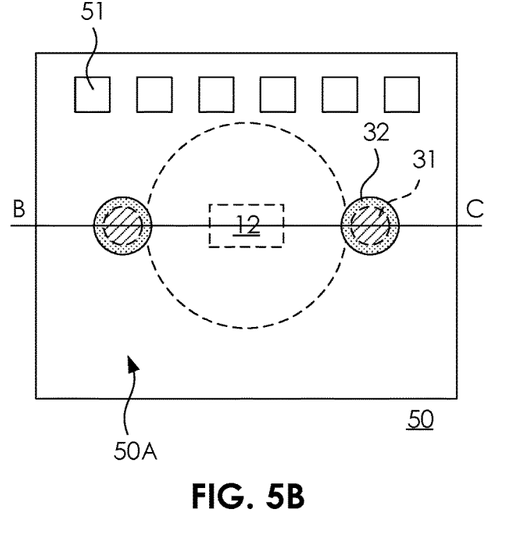
FIG. 5B illustrates a top view of a semiconductor structure according to some embodiments of the present disclosure.
Figure 5C:
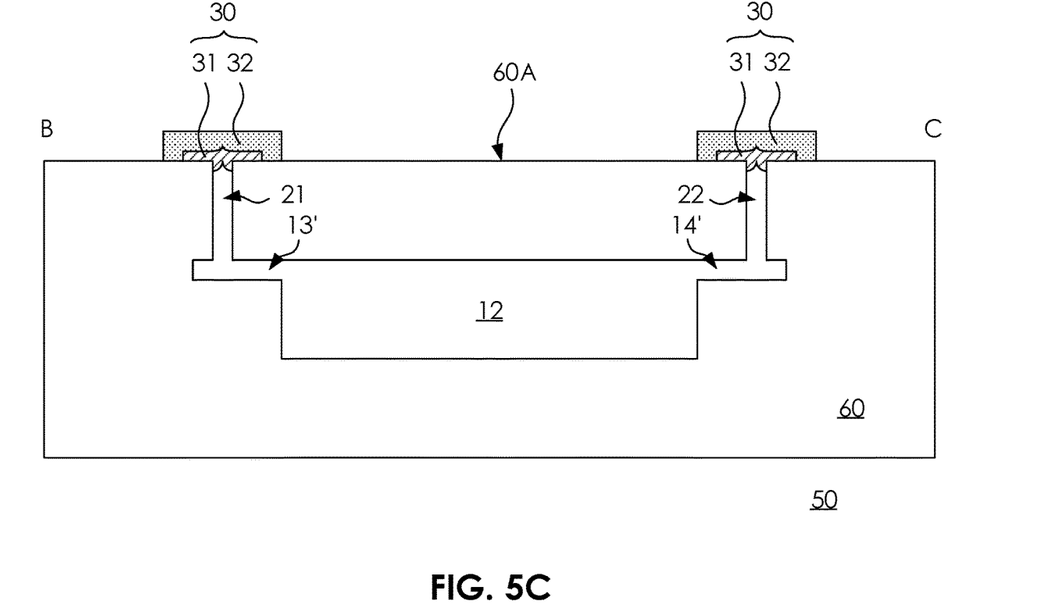
FIG. 5C illustrates a cross-sectional view of a semiconductor structure according to some embodiments of the present disclosure.

According to the embodiments shown in FIGS. 1 to 3, the present disclosure may provide a semiconductor structure that includes stacked substrates or wafers and a cavity formed therein, and such semiconductor structure may be utilized in a MEMS device, for example, a pressure sensor. Accordingly, as illustrated in FIGS. 5A to 5C, a pressure sensor having a high or ultra-high vacuum sealing requirement may include the semiconductor structure provided in the present disclosure. FIG. 5A is a top view of the pressure sensor formed without sealing the through holes by the eutectic sealing structure, whereas FIG. 5B is a top view of a pressure sensor in which the through holes are sealed. FIG. 5C is a cross-sectional view of the pressure sensor in FIG. 5B along a line BC.

In some embodiments, the pressure sensor 50 may include a semiconductor stack 60 and a cavity 12 therein. The semiconductor stack 60 may be formed by stacking a plurality of substrates or wafers such as the first and second substrates 10, 20 as shown in previous embodiments, the bonding surfaces between the plurality of substrates or wafers in the semiconductor stack 60 are omitted in FIG. 5C. The cavity 12 may be formed in the semiconductor stack 60 according to the profiles of the stacked substrates. The semiconductor stack 60 may include a plurality of through holes 21, 22 at a first surface 60A of the semiconductor stack 60, wherein the through holes 21, 22 are connected to or in fluid communication with the cavity 12. A plurality of eutectic sealing structures 30 may be disposed on the semiconductor stack 60 and cover the plurality of through holes 21, 22 for sealing the cavity 12. Each of the eutectic sealing structures 30 includes the first metal layer 31 and the second metal layer 32 eutectically bonded on the first metal layer 31. Features of the first metal layer 31 and the second metal layer 32 are identical to those of previous embodiments, and repeated descriptions are omitted here for brevity.

As shown in FIG. 5A, in some embodiments, the plurality of through holes 21, 22 are distributed surrounding the cavity 12 from a top view perspective. In some embodiments, the semiconductor stack 60 includes a plurality of micro channels 13', 14' inside for connecting the cavity 12 to the plurality of through holes 21, 22. In some embodiments, the pressure sensor 50 further includes a plurality of conductive pads 51 on the first surface 50A. The conductive pads 51 are utilized to provide electrical leadouts.

Figure 6:
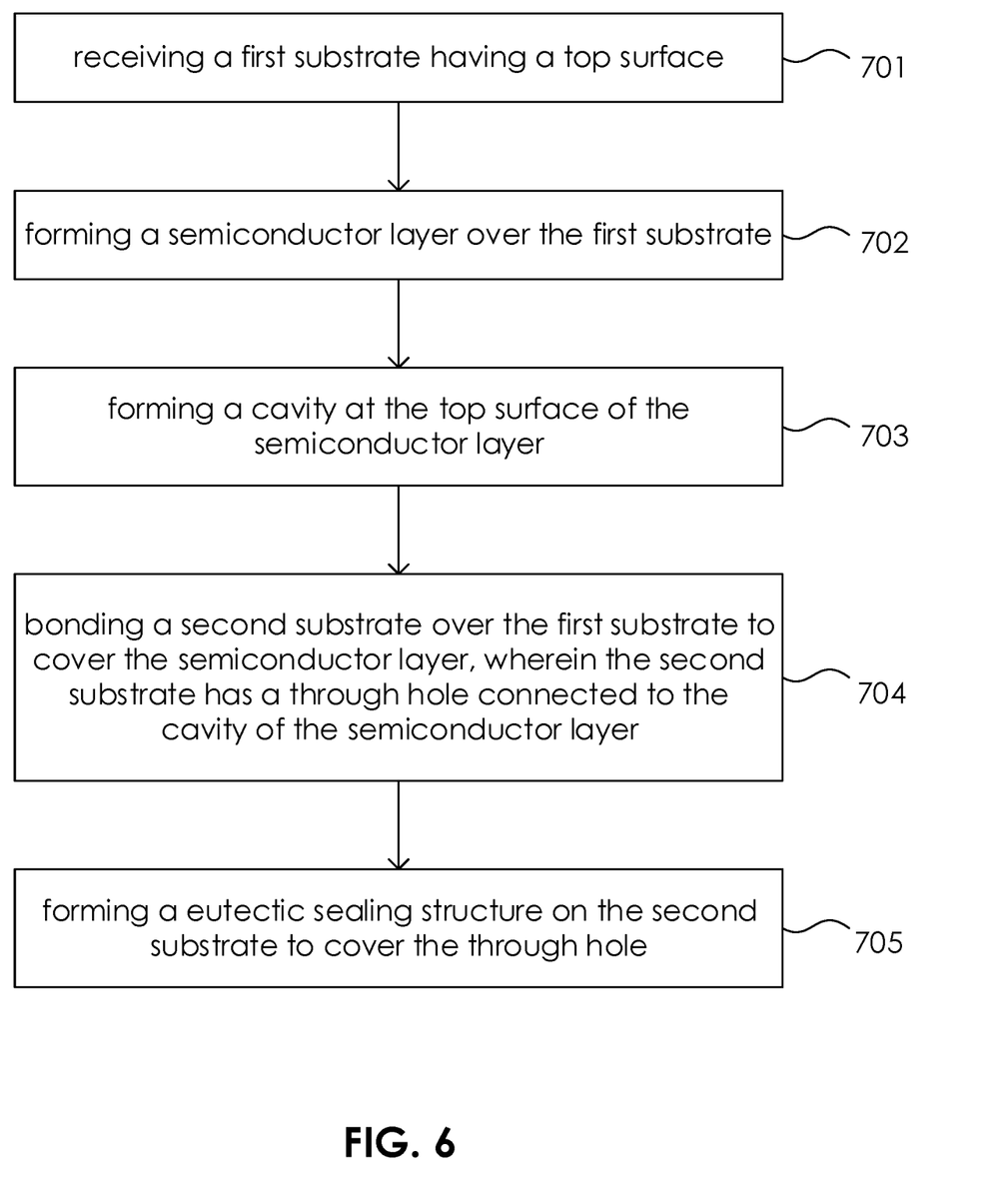
FIG. 6 illustrates a flow chart of monitoring static charge according to some embodiments of the present disclosure.

FIG. 6 illustrates a flow chart of manufacturing a semiconductor structure according to some embodiments of the present disclosure. In some embodiments, the method includes an operation 701: receiving a first substrate having a top surface; an operation 702: forming a semiconductor layer over the first substrate; an operation 703: forming a cavity at the top surface of the semiconductor layer; an operation 704: bonding a second substrate over the first substrate to cover the semiconductor layer, wherein the second substrate has a through hole connected to the cavity of the semiconductor layer; and an operation 705: forming a eutectic sealing structure on the second substrate to cover the through hole.

Figure 7A:
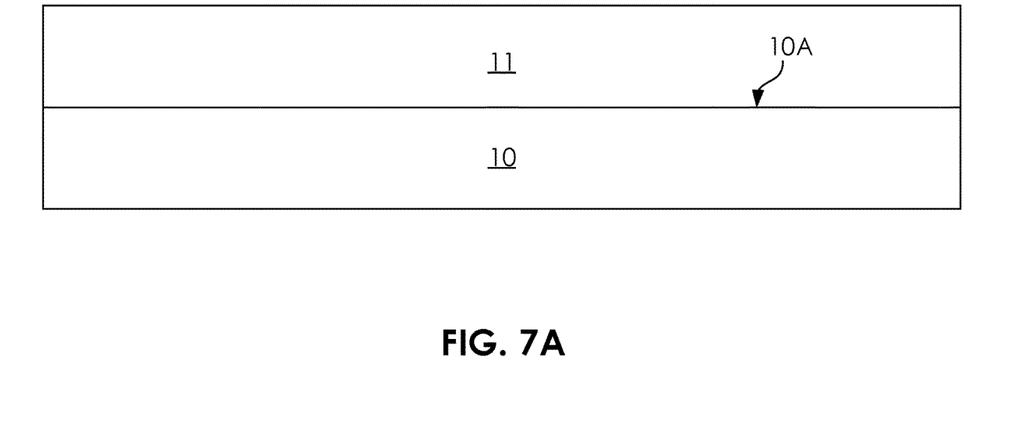
FIGS. 7A to 7F illustrate cross-sectional views of forming semiconductor structure according to some embodiments of the present disclosure.
Figure 7B:
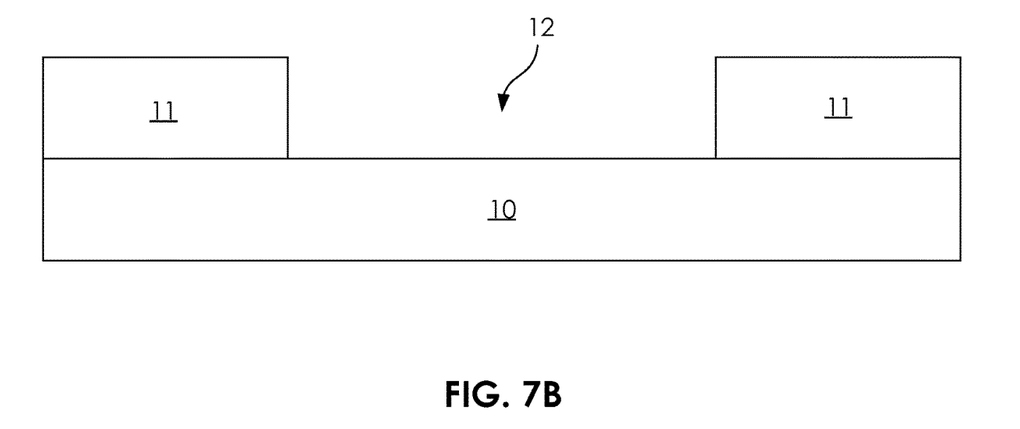

Referring to FIGS. 7A and 7B, in the operations of forming the semiconductor layer 11 over the first substrate 10 and forming the cavity 12, in some embodiments, a semiconductor material such as germanium (Ge), silicon (Si), silicon germanium (SiGe), or the like, may be blanketly deposited on the top surface 10A of the first substrate 10, and the cavity 12 may be formed by an etch-back operation. In some embodiments, a plurality of semiconductor bulks may be bonded to the top surface 10A, and may be arranged to form the cavity 12. In some embodiments, the semiconductor layer 11 is an upper portion of the first substrate 10, and the cavity 12 may be formed by patterning the upper portion of the first substrate 10. In some embodiments, the semiconductor layer 11 is another substrate or wafer that is sandwiched by the first substrate 10 and the second substrate 20, wherein the cavity 12 is formed by patterning such substrate.

Figure 7C:
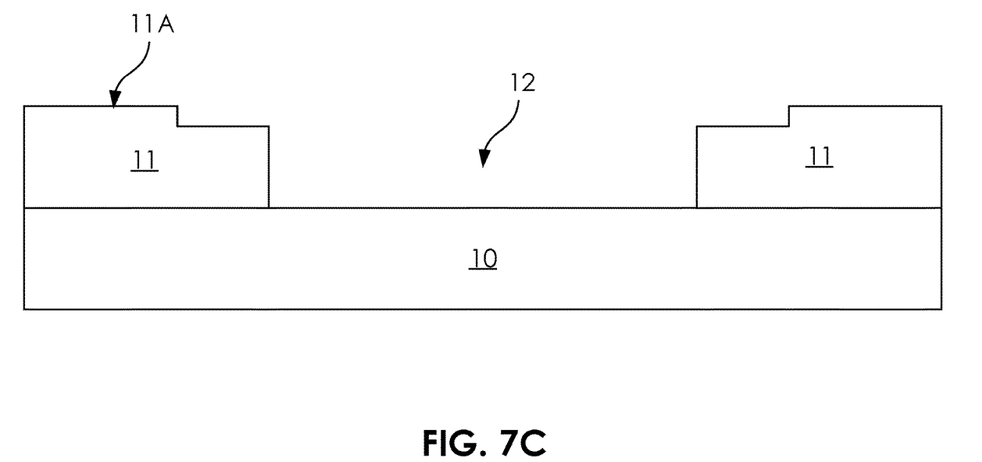

Referring to FIG. 7C, in some embodiments, the first trench 13 and the second trench 14 may be formed adjacent to the cavity 12 at the top surface 11A of the semiconductor layer 11. The first trench 13 and the second trench 14 are shallow trenches that are used as micro channels.

Figure 7D:
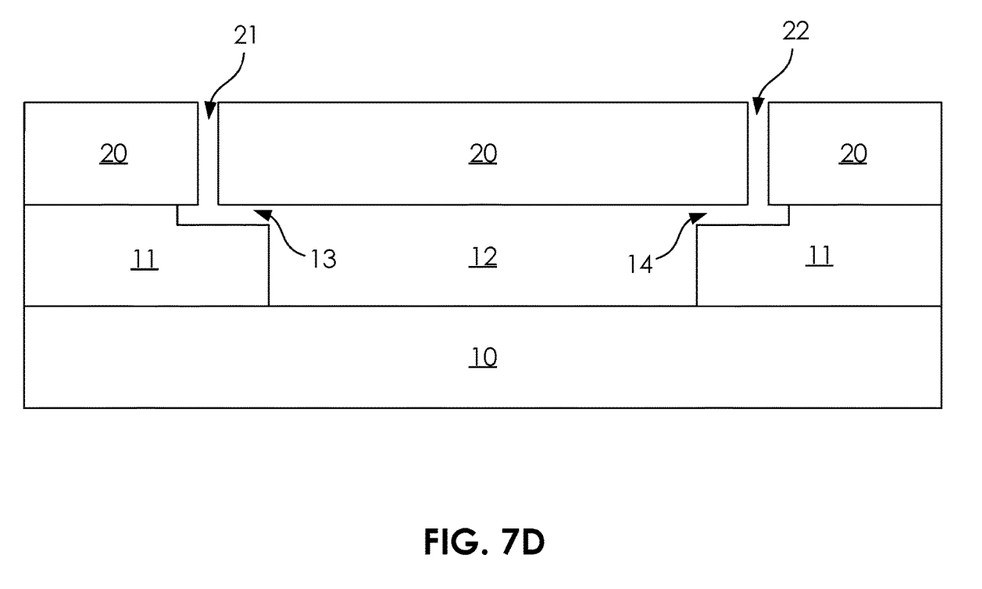

Referring to FIG. 7D, in some embodiments, the second substrate 20 may be bonded over the first substrate 10. The second substrate 20 may be in contact with the semiconductor layer 11 over the first substrate 10. In some embodiments, the second substrate 20 is bonded on the semiconductor layer 11 by eutectic bonding. The second substrate 20 may include the plurality of through holes 21, 22 prior to being bonded on the semiconductor layer 11.

Due to the bonding of the second substrate 20 over the first substrate 10, the through holes 21, 22 may be directly connected to the cavity 12; for example, the through holes 21, 22 may overlap the cavity 12 from a top view perspective. In other embodiments, the open sides of the first trench 13 and the second trench 14 are covered by the second substrate 20, and the through holes 21, 22 overlap the first trench 13 and the second trench 14, thus the first trench 13 and the second trench 14 may be formed with the aforementioned micro channels for connecting the through holes 21, 22 and the cavity 12. In some embodiments, the first through hole 21 and the second through hole 22 may be formed after the second substrate 20 is bonded over the first substrate 10.

In some embodiments, the critical dimensions (CD) of the first through hole 21 and the second through hole 22 may be greater than about 0.3 μm because the thickness of the second substrate 20 may be in a range between about 170 μm and about 180 μm. Generally, a smaller through hole may be sealed more easily; however, the reduction of the critical dimension is limited by etching capability, and therefore the present disclosure uses the eutectic sealing structure to seal instead of attempting to improve the sealing performance by reduction of critical dimensions of the through holes.

In some embodiments, prior to the forming of the eutectic sealing structures on the second substrate 20 to cover the first through hole 21 and the second through hole 22, the cavity 12 may be brought to a low or an extreme-low pressure status. For instance, an absolute pressure sensor may be made by hermetically sealing the cavity 12 through the through holes, and the pressure in the cavity 12 may be lower than several mTorr, for example, approximately 25 mTorr.

Figure 7E:
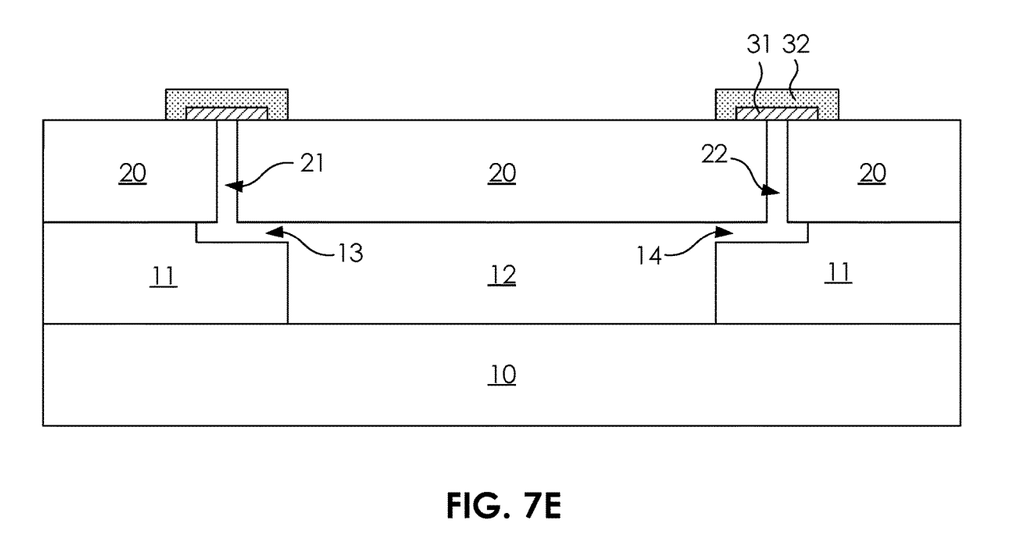

Referring to FIG. 7E, in some embodiments, the first metal layer 31 may be disposed over the first through hole 21 and the second through hole 22, and the second metal layer 32 may be disposed over the first metal layer 31. Because the present disclosure utilizes the property of subsequently-formed eutectic metal to seal the cavity 12, the property of the first metal layer 31 itself may not constrain the critical dimensions of the first through hole 21 and the second through hole 22. Accordingly, in some embodiments, the widths of the first through hole 21 and the second through hole 22 may be greater than a couple of micrometers, for example, in a range of from about 1 μm to about 3 μm.

In some embodiments, the materials of the first metal layer 31 and the second metal layer 32 may include aluminum (Al), germanium (Ge), copper (Cu), gold (Au), stannum (Sn), indium (In), lead (Pb), or palladium (Pd). For instance, the materials for forming the first metal layer 31 and the second metal layer 32 may be grouped or combined as Al/Ge, Au/Sn, In/Pd, Pb/Sn, Cu/Sn, or the like. The order of the selected materials may be reversed, for example, the first metal layer 31 and the second metal layer 32 may be made of the combinations of Au/Sn or Sn/Au. In some embodiments, the masses of the first metal layer 31 and the second metal layer 32 are based on the eutectic property of the metals; for example, the first metal layer 31 may be stannum in a range of about 18 wt % to 22 wt % of the eutectic sealing structure, whereas the second metal layer 32 may be gold in a range of about 78 wt % to 82 wt % of the eutectic sealing structure. In some embodiments, in order to ensure that the eutectic region 320 as shown in FIG. 4A may seal the cavity properly, the first metal layer 31 is not only covered by the second metal layer 32, but also laterally surrounded by the second metal layer 32.

Figure 7F:
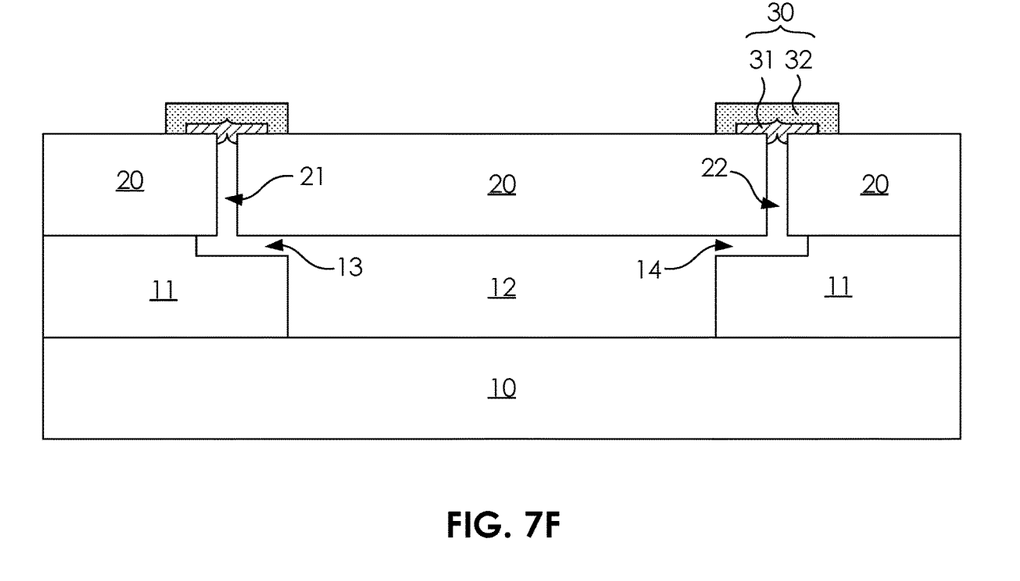

Referring to FIG. 7F, in some embodiments, the first metal layer 31 and the second metal layer 32 are annealed at a eutectic temperature. The eutectic temperature is related to the eutectic properties of the first metal layer 31 and the second metal layer 32. For instance, the eutectic temperature may be in a range between about 420 degrees Celsius and about 430 degrees Celsius when Al/Ge is utilized or may be in a range between about 280 degrees Celsius and about 300 degrees Celsius when Au/Sn is utilized. By annealing the first metal layer 31 and the second metal layer 32 at the eutectic temperature, two metals may diffuse to each other and thereby form the eutectic region 320 for effectively preventing micro leaks from forming in the sealing structure. In some embodiments, the first metal layer 31 may fill the first through hole 21 and the second through hole 22 during the annealing operation caused by the enhanced fluidity of the first metal layer 31 under the eutectic temperature, and a portion of an inner surface of each of the through holes may thereby be covered by the first metal layer 31. Furthermore, while the first metal layer 31 is slightly filling the first through hole 21 and the second through hole 22 therebelow during the annealing operation, the protrusions 310 (as previously shown in FIGS. 4A to 4C) that overlapping the first through hole 21 and the second through hole 22 may be formed due the direction of fluidity. For example, the first metal layer 31 may tend to move toward the center of the first metal layer 31 and thus slightly changes the upper profile of the first metal layer 31.

Furthermore, the annealing operation in the present disclosure may be implemented in an annealing furnace, and the pressure in the cavity is thus tunable by controlling the gas pressure in the annealing furnace. In other words, the cavity pressure can be tunable for more applications. In addition, via annealing, the native oxide can be effectively removed during the eutectic metal process, and thus the semiconductor structure with a eutectic sealing structure may provide better performance.

According to the present disclosure, a semiconductor structure and method for manufacturing thereof are disclosed. Overall, the disclosed semiconductor structure includes a eutectic sealing structure that may improve the cavity sealing performance and meet different cavity pressure requirements in different usages of the sealed cavity structures by using the eutectic metal scheme.

In one exemplary aspect, a semiconductor structure is provided. The semiconductor structure includes a first substrate, a semiconductor layer, a second substrate, and a eutectic sealing structure. The semiconductor layer is over the first substrate. The semiconductor layer has a cavity at least partially through the semiconductor layer. The second substrate is over the semiconductor layer. The second substrate has a through hole. The eutectic sealing structure is on the second substrate and covers the through hole. The eutectic sealing structure comprises a first metal layer and a second metal layer eutectically bonded on the first metal layer.

In another exemplary aspect, a semiconductor structure is provided. The semiconductor structure includes a semiconductor stack, a cavity, a plurality of through holes, and a plurality of eutectic sealing structures. The semiconductor stack has a first surface. The cavity is in the semiconductor stack. The plurality of through holes are at the first surface of the semiconductor stack and connected to the cavity. The plurality of eutectic sealing structures are on the semiconductor stack and covering the plurality of the through holes for sealing the cavity. Each of the eutectic sealing structures comprises a first metal layer and a second metal layer eutectically bonded on the first metal layer.

In yet another exemplary aspect, a method for manufacturing a semiconductor structure is provided. The method includes the operations as follows. A first substrate having a top surface is received. A semiconductor layer is formed over the first substrate. A cavity is formed at the top surface of the semiconductor layer. A second substrate is bonded over the first substrate to cover the semiconductor layer. The second substrate has a through hole connected to the cavity of the semiconductor layer. A eutectic sealing structure is formed on the second substrate to cover the through hole. The eutectic sealing structure comprises a first metal layer and a second metal layer eutectically bonded on the first metal layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first substrate;
a semiconductor layer over the first substrate, the semiconductor layer having a cavity at least partially through the semiconductor layer;
a second substrate over the semiconductor layer, the second substrate having a through hole; and
a eutectic sealing structure on the second substrate and covering the through hole;
wherein the eutectic sealing structure comprises a first metal layer and a second metal layer eutectically bonded on the first metal layer, and wherein the first metal layer has a protrusion at a top surface of the first metal layer.

2. The semiconductor structure of claim 1, wherein a portion of the first metal layer extends into the through hole.

3. The semiconductor structure of claim 1, wherein the first metal layer is substantially covered by the second metal layer.

4. The semiconductor structure of claim 1, wherein the protrusion overlaps the through hole of the second substrate.

5. The semiconductor structure of claim 1, wherein the eutectic sealing structure comprises aluminum (Al), germanium (Ge), copper (Cu), gold (Au), stannum (Sn), indium (In), lead (Pb), or palladium (Pd).

6. The semiconductor structure of claim 1, wherein the semiconductor layer further comprises a trench adjacent to the cavity at least partially through the semiconductor layer, wherein a bottom surface of the trench is higher than a bottom surface of the cavity.

7. The semiconductor structure of claim 6, wherein the through hole is connected to the cavity through the trench.

8. The semiconductor structure of claim 1, wherein the through hole is over the cavity of the semiconductor layer.

9. The semiconductor structure of claim 1, wherein a width of the through hole is in a range of from about 0.3 µm to about 0.8 µm.

10. A semiconductor structure, comprising:
a semiconductor stack having a first surface;
a cavity in the semiconductor stack;
a plurality of through holes at the first surface of the semiconductor stack and connected to the cavity; and
a plurality of eutectic sealing structures on the semiconductor stack and covering the plurality of the through holes for sealing the cavity;
wherein each of the eutectic sealing structures comprises a first metal layer and a second metal layer eutectically bonded on the first metal layer, and wherein the first metal layer has a protrusion at a top surface of the first metal layer.

11. The semiconductor structure of claim 10, wherein the plurality of the through holes surround the cavity from a top view perspective.

12. The semiconductor structure of claim 11, further comprising a plurality of micro channels in semiconductor stack for connecting the cavity and the plurality of the through holes.

13. The semiconductor structure of claim 10, wherein the plurality of the through holes overlap the cavity from a top view perspective.

14. The semiconductor structure of claim 10, further comprising a plurality of conductive pads on the first surface.

15. A semiconductor structure, comprising:
a first substrate;
a semiconductor layer over the first substrate, the semiconductor layer having a cavity at least partially through the semiconductor layer;
a second substrate over the semiconductor layer, the second substrate having a through hole; and
a eutectic sealing structure on the second substrate and covering the through hole, the eutectic sealing structure comprising a first metal layer and a second metal layer eutectically bonded on the first metal layer;
wherein a portion of the eutectic sealing structure extends into the through hole along an inner surface of the through hole, and wherein the first metal layer has a protrusion at a top surface of the first metal layer.

16. The semiconductor structure of claim 15, wherein a thickness of the portion of the eutectic sealing structure proximal to the inner surface of the through hole is greater than a thickness of the portion of the eutectic sealing structure distal to the inner surface of the through hole.

17. The semiconductor structure of claim 15, wherein the second metal layer of the eutectic sealing structure is free from extending into the through hole.

18. The semiconductor structure of claim 15, wherein the cavity sealed by the eutectic sealing structure comprises a pressure lower than about 25 mTorr.

19. The semiconductor structure of claim 15, wherein a height of the protrusion is less than a thickness of a portion of the first metal layer having a flat surface.

20. The semiconductor structure of claim 15, wherein the first metal layer comprises an inward curve in the through hole.

* * * * *